US009661788B2

(12) United States Patent
Slessman et al.

(10) Patent No.: US 9,661,788 B2
(45) Date of Patent: *May 23, 2017

(54) MODULAR DATA CENTER

(71) Applicant: BASELAYER TECHNOLOGY, LLC, Chandler, AZ (US)

(72) Inventors: William Slessman, Paradise Valley, AZ (US); Steve Durand, Anthem, AZ (US); Rose Gilbert, Tempe, AZ (US); Andreas Zoll, Scottsdale, AZ (US)

(73) Assignee: BASELAYER TECHNOLOGY, LLC, Chandler, AZ (US)

( * ) Notice: Subject to any disclaimer, the term of this patent is extended or adjusted under 35 U.S.C. 154(b) by 582 days.

This patent is subject to a terminal disclaimer.

(21) Appl. No.: 14/042,087

(22) Filed: Sep. 30, 2013

(65) Prior Publication Data
US 2014/0190191 A1 Jul. 10, 2014

Related U.S. Application Data

(63) Continuation-in-part of application No. 13/839,709, filed on Mar. 15, 2013, now Pat. No. 9,237,681.

(60) Provisional application No. 61/750,689, filed on Jan. 9, 2013.

(51) Int. Cl.
*H05K 7/20* (2006.01)
(52) U.S. Cl.
CPC ................ *H05K 7/20836* (2013.01)
(58) Field of Classification Search
CPC ............ H05K 7/20745; H05K 7/20836; F24F 5/0035
USPC ................ 62/186, 259.4, 314, 332
See application file for complete search history.

(56) References Cited

U.S. PATENT DOCUMENTS

| 3,859,818 A | 1/1975 | Goettl |
| 4,178,764 A | 12/1979 | Rowe |
| 5,970,723 A | 10/1999 | Kinkel et al. |
| 6,223,545 B1 | 5/2001 | Kinkel et al. |
| 6,681,584 B1 | 1/2004 | Conner |
| 8,151,578 B1 | 4/2012 | Morales et al. |

(Continued)

FOREIGN PATENT DOCUMENTS

| WO | 2011148175 A2 | 12/2011 |
| WO | 2012099464 A1 | 7/2012 |

OTHER PUBLICATIONS

European Patent Office International Searching Authority, International Search Report for International Application No. PCT/US2014/010708 mailed Jun. 6, 2014.

(Continued)

*Primary Examiner* — Marc Norman
(74) *Attorney, Agent, or Firm* — Lorenz & Kopf, LLP.

(57) ABSTRACT

Described are methods, systems, and apparatus, including computer program products, relating to an air module and control thereof. An air module can include a controller, an air intake module configured to receive first air from a first air source and to receive second air from a second air source, an evaporative cooling module in fluid communication with the air intake module, and a mechanical cooling module in fluid communication with the evaporative cooling module. The controller can be configured to cause the intake module to mix the first air and the second air to form intake air, and selectively cool the intake air to form supply air by at least one of causing the evaporative cooling module to selectively cool the intake air, and causing the mechanical cooling module to selectively cool the intake.

20 Claims, 7 Drawing Sheets

(56) References Cited

U.S. PATENT DOCUMENTS

| | | |
|---|---|---|
| 8,195,335 B2 | 6/2012 | Kreft et al. |
| 2009/0210096 A1 | 8/2009 | Stack et al. |
| 2010/0154448 A1 | 6/2010 | Hay |
| 2012/0065809 A1 | 3/2012 | Allard et al. |
| 2012/0234527 A1 | 9/2012 | Murayama et al. |

OTHER PUBLICATIONS

USPTO, Office Action for U.S. Appl. No. 13/839,709 mailed May 28, 2015.
The International Bureau of WIPO, International Preliminary Report on Patentability and Written Opinion for International Application No. PCT/US2014/010708 mailed Jul. 23, 2015.

MODULAR DATA CENTER

CROSS-REFERENCES TO RELATED APPLICATIONS

This application claims the benefit of, and priority to U.S. Patent Application No. 61/750,689, filed on Jan. 9, 2013, and titled, "Modular Data Center," the entire contents of which are incorporated herein by reference. This application is a Continuation-In-Part of U.S. patent application Ser. No. 13/839,709, filed on Mar. 15, 2013, and titled, "Modular Data Center," the entire contents of which are incorporated herein by reference.

TECHNOLOGICAL FIELD

The present technology relates generally to data centers and, more specifically, to modular data centers.

BACKGROUND

Generally, data centers are facilities that support the operation of IT equipment. In one aspect, a data center can involve managing the environment of the IT equipment (e.g., managing the temperature of the environment surrounding the IT equipment) to provide cooling for the IT equipment. Typical approaches to managing the environment of the IT equipment can include the use of conventional HVAC units to mechanically cool air. Such approaches can rely exclusively on mechanically cooling the air within the data center, which can lead to excessive power usage and inefficiency.

SUMMARY

Accordingly, there is a need for methods and systems for efficiently managing the data center environment. In one aspect, an air module can include a controller; an air intake module configured to receive first air from a first air source and to receive second air from a second air source; an evaporative cooling module in fluid communication with the air intake module; and a mechanical cooling module in fluid communication with the evaporative cooling module. The controller can be configured to cause the intake module to mix, based on at least a supply air temperature set point, the first air and the second air to form intake air, and selectively cool the intake air to form supply air by at least one of causing the evaporative cooling module to selectively cool, based on at least the supply air temperature set point, the intake air, and causing the mechanical cooling module to selectively cool the intake air based on at least the supply air temperature set point. In various embodiments, a controller may execute logic to evaluate conditions and determine instructions for assessing and controlling data center operating conditions. In various embodiments a data center intelligent control system is a computer-based software system that gathers and analyzes data, generates instructions and communicates instructions to the controller.

In another aspect, a computer implemented method for controlling an air module can include generating, by a controller, a first instruction to cause an intake module to selectively mix, based upon a supply air temperature set point, first air and second air to form intake air; generating, by the controller, a second instruction to selectively cool the intake air to form supply air, wherein the second instruction includes at least one of instructions to cause an evaporative cooling module to selectively cool, based on at least the supply air temperature set point, the intake air, and instructions to cause a mechanical cooling module to selectively cool, based on at least the supply air temperature set point, the intake air.

In another aspect, a modular data center includes an air module. The air module can include an air module controller; an air intake module configured to receive first air from a first air source and to receive second air from a second air source; an evaporative cooling module in fluid communication with the air intake module; and a mechanical cooling module in fluid communication with the evaporative cooling module. The air module controller can be configured to cause the intake module to mix the first air and the second air based on at least a supply air temperature set point to form intake air, and the controller can be configured to form supply air by at least one of causing the evaporative cooling module to cool the intake air selectively based on at least the supply air temperature set point, and causing the mechanical cooling module to cool the intake air selectively based on at least the supply air temperature set point. The modular data center can include one or more data center modules and a supply air conduit in fluid communication with the air module and a data center module of the one or more data center modules to carry supply air from the air module to the one or more data center modules.

In some embodiments, the first air source is a source of return air. In some embodiments, the second air source is a source of outside air.

In some embodiments, the controller is further configured to form the supply air substantially from the first air, if a temperature of the first air is less than the supply air temperature set point.

In some embodiments, the controller is further configured to form the supply air by mixing the first air and the second air, if a first temperature of the first air is greater than the supply air temperature set point, a second temperature of the second air is less than or equal to the supply air temperature set point, and a dew point of the second air is less than or equal to an upper limit of a dew point range and greater than or equal to a lower limit of the dew point range.

In some embodiments, the controller is further configured to form mixed air by mixing the first air and the second air, if a first temperature of the first air is greater than the supply air temperature set point, a second temperature of the second air is less than the first temperature, a dew point of the second air is less than a lower limit of a dew point range, and a wet bulb temperature of the second air is less than or equal to a wet bulb temperature corresponding to the supply air temperature set point at the lower limit of a dew point range, and form the supply air by evaporatively cooling the mixed air with the evaporative cooling module.

In some embodiments, the controller is further configured to form supply air substantially from the second air by evaporatively cooling the second air with the evaporative cooling module, if a first temperature of the first air is greater than the supply air temperature set point, a second temperature of the second air is greater than the supply air temperature set point, a dew point of the second air is less than or equal to an upper limit of a dew point range, and a wet bulb temperature of the second air is within an evaporative cooling wet bulb temperature range.

In some embodiments, the controller is further configured to form supply air substantially from the first air by mechanically cooling the first air with the mechanical cooling module, if a dew point of the second air is greater than an upper limit of a dew point range, a dew point of the first air is less than or equal to an upper limit of a dew point range, and a first temperature of the first air is greater than the supply air temperature set point. In some embodiments, the controller is further configured to form supply air substantially from the first air by mechanically cooling the first air with the mechanical cooling module, if a wet bulb temperature of the second air is greater than or equal to an upper limit of an evaporative cooling wet bulb temperature range, a dew point of the first air is less than or equal to an upper limit of a dew point range, and a first temperature of the first air is greater than the supply air temperature set point.

In some embodiments, the controller is further configured to form supply air substantially from the first air by mechanically cooling the first air with the mechanical cooling module, if a dew point of the first air is greater than an upper limit of a dew point range, and a dew point of the second air is greater than the upper limit of a dew point range. In some embodiments, the controller is further configured to form supply air substantially from the first air by mechanically cooling the first air with the mechanical cooling module, if a dew point of the first air is greater than an upper limit of a dew point range and a wet bulb temperature of the second air is greater than or equal to an upper limit of an evaporative cooling wet bulb temperature range.

In some embodiments, the controller is further configured to form supply air substantially from the second air by evaporatively cooling the second air with the evaporative cooling module, if a dew point of the first air is less than a lower limit of a dew point range, a dew point of the second air is less than the lower limit of the dew point range, a first temperature of the first air is greater than the supply air temperature set point, a second temperature of the second air is greater than the first temperature of the first air, and a wet bulb temperature of the second air is less than a wet bulb temperature corresponding to the supply air temperature set point at the lower limit of the dew point range.

In some embodiments, the controller is further configured to form mixed air by mixing the first air and the second air, if the second temperature of the second air is greater than the first temperature of the first air, a dew point of the first air is greater than a lower limit of a dew point range, and a dew point of the second air is less than the lower limit the dew point range; and to form the supply air by evaporatively cooling the mixed air with the evaporative cooling module.

In some embodiments, the first instruction includes instructions to form the intake air substantially from the first air, if a temperature of the first air is less than the supply air temperature set point.

In some embodiments, the first instruction includes instructions to form the intake air by mixing the first air and the second air, if a first temperature of the first air is greater than the supply air temperature set point, a second temperature of the second air is less than or equal to the supply air temperature set point, and a dew point of the second air is less than or equal to an upper limit of a dew point range and greater than or equal to a lower limit of the dew point range.

In some embodiments, the first instruction includes instructions to form intake air by mixing the first air and the second air, wherein the second instruction includes instructions to cause the evaporative cooling module to selectively cool, based on at least the supply air temperature set point, the intake air, if a first temperature of the first air is greater than the supply air temperature set point, a second temperature of the second air is less than the first temperature, a dew point of the second air is less than a lower limit of a dew point range, and a wet bulb temperature of the second air is less than or equal to a wet bulb temperature corresponding to the supply air temperature set point at the lower limit of a dew point range.

In some embodiments, the first instruction includes instructions to create intake air substantially from second air and the second instruction includes instructions to cause the evaporative cooling module to selectively cool, based on at least the supply air temperature set point, the intake air, if a first temperature of the first air is greater than the supply air temperature set point, a second temperature of the second air is greater than the supply air temperature set point, a dew point of the second air is less than or equal to an upper limit of a dew point range, and a wet bulb temperature of the second air is within an evaporative cooling wet bulb temperature range.

In some embodiments, the first instruction includes instructions to create intake air substantially from first air, wherein the second instruction includes instructions to cause the mechanical cooling module to selectively cool, based on at least the supply air temperature set point, the intake air, if a dew point of the second air is greater than an upper limit of a dew point range, a dew point of the first air is less than or equal to an upper limit of a dew point range, and a first temperature of the first air is greater than the supply air temperature set point. In some embodiments, the first instruction includes instructions to create intake air substantially from first air, wherein the second instruction includes instructions to cause the mechanical cooling module to selectively cool, based on at least the supply air temperature set point, the intake air, if a wet bulb temperature of the second air is greater than or equal to an upper limit of an evaporative cooling wet bulb temperature range, a dew point of the first air is less than or equal to an upper limit of a dew point range, and a first temperature of the first air is greater than the supply air temperature set point.

In some embodiments, the first instruction includes instructions to create intake air substantially from first air, wherein the second instruction includes instructions to cause the mechanical cooling module to selectively cool, based on at least the supply air temperature set point, the intake air, if a dew point of the first air is greater than an upper limit of a dew point range and a dew point of the second air is greater than the upper limit of a dew point range. In some embodiments, the first instruction includes instructions to create intake air substantially from first air and the second instruction comprises instructions to cause the mechanical cooling module to selectively cool, based on at least the supply air temperature set point, the intake air, if a dew point of the first air is greater than an upper limit of a dew point range, and a wet bulb temperature of the second air is greater than or equal to an upper limit of an evaporative cooling wet bulb temperature range.

In some embodiments, the first instruction includes instructions to create intake air substantially from second air and the second instruction includes instructions to cause the evaporative cooling module to selectively cool, based on at least the supply air temperature set point, the intake air, if a dew point of the first air is less than a lower limit of a dew point range, a dew point of the second air is less than the lower limit of the dew point range, a first temperature of the first air is greater than the supply air temperature set point, a second temperature of the second air is greater than the first temperature of the first air, and a wet bulb temperature of the second air is less than a wet bulb temperature corresponding to the supply air temperature set point at the lower limit of the dew point range.

In some embodiments, the first instruction includes instructions to form intake air by mixing the first air at a first temperature and the second air at a second temperature and the second instruction includes instructions to cause the evaporative cooling module to selectively cool, based on the at least the supply air temperature set point, the intake air, if the second temperature of the second air is greater than the first temperature of the first air, a dew point of the first air is greater than a lower limit of a dew point range, and a dew point of the second air is less than the lower limit the dew point range.

In some embodiments, the modular data center can include a data center module controller. In some embodiments, the modular data center can include a data center module intake damper configured to control supply air entering the data center module from the supply air conduit. In some embodiments, the data center module controller is configured to actuate the data center module intake damper based on at least one of a temperature and humidity of air in the data center module. In some embodiments, the air module further includes a fan array. In some embodiments, the air module controller is further configured to adjust an air flow of the fan array to maintain a substantially constant air pressure in the supply air conduit.

BRIEF DESCRIPTION OF THE DRAWINGS

The foregoing and other objects, features, and advantages of the present technology, as well as the technology itself, will be more fully understood from the following description of various embodiments, when read together with the accompanying drawings, in which.

DETAILED DESCRIPTION

Described herein are modular data centers and methods of controlling the same. In some embodiments, a data center can provide an operating environment for IT equipment, such as servers, storage devices, networking devices, power distribution equipment, uninterruptible power supplies, etc. For example, a data center can facilitate cooling IT equipment, which can generate heat when operating. In some embodiments, a data center can include an air module and one or more data center modules (e.g., data modules or other data center modules) housed in a building (e.g., in a large open space within the building). Air modules can intake air from the surrounding environment ("return air") (e.g., air from within the building housing the data center). Air modules can intake air from the outdoors ("outside air") (e.g., via a duct connected to the exterior of the building housing the data center). Air modules can condition return air, outside air, and/or a mixture thereof to provide to the data modules. Air modules can be connected to data modules via ducts, pipes, or other conduits to provide conditioned air ("supply air") to the data modules. Within the data modules, heat energy can be transferred from IT equipment to air. Air within the data modules can be exhausted from the data modules via vents, ducts, pipes, or other conduits. Air within the data modules can be exhausted from the data modules via vents, ducts, pipes, or other conduits connected to one or more air modules. Air can be exhausted from the data modules into the surrounding environment (e.g., into the building housing the data center). In some embodiments, the supply air from the air modules can be at a lower temperature than the air within the data modules. When the supply air enters the data module, it can be used to cool IT equipment. As a result of cooling IT equipment within the data module, return air can be at an elevated temperature. In some embodiments, air modules can cool and/or heat the return air before providing it to the data modules as supply air.

As will be described in greater detail below, an air module can use different techniques to provide supply air at a desired temperature and/or humidity. For example, the air module can selectively mix return air with outside air to form intake air and/or supply air. The air module can selectively utilize evaporative cooling (e.g., direct or indirect evaporative cooling) to cool intake air and/or change its humidity. The air module can utilize a fluid-based heat exchanger (e.g., mechanical cooling or a cooling coil) to cool intake air. The air module can utilize a dehumidifier to reduce the humidity of intake air. The air module can utilize a heater to heat intake air. In some embodiments, selective use of these different techniques can increase the efficiency of the air module providing supply air (e.g., by using less power to provide supply air to the data modules at a desired temperature and/or humidity).

Figure 1A:
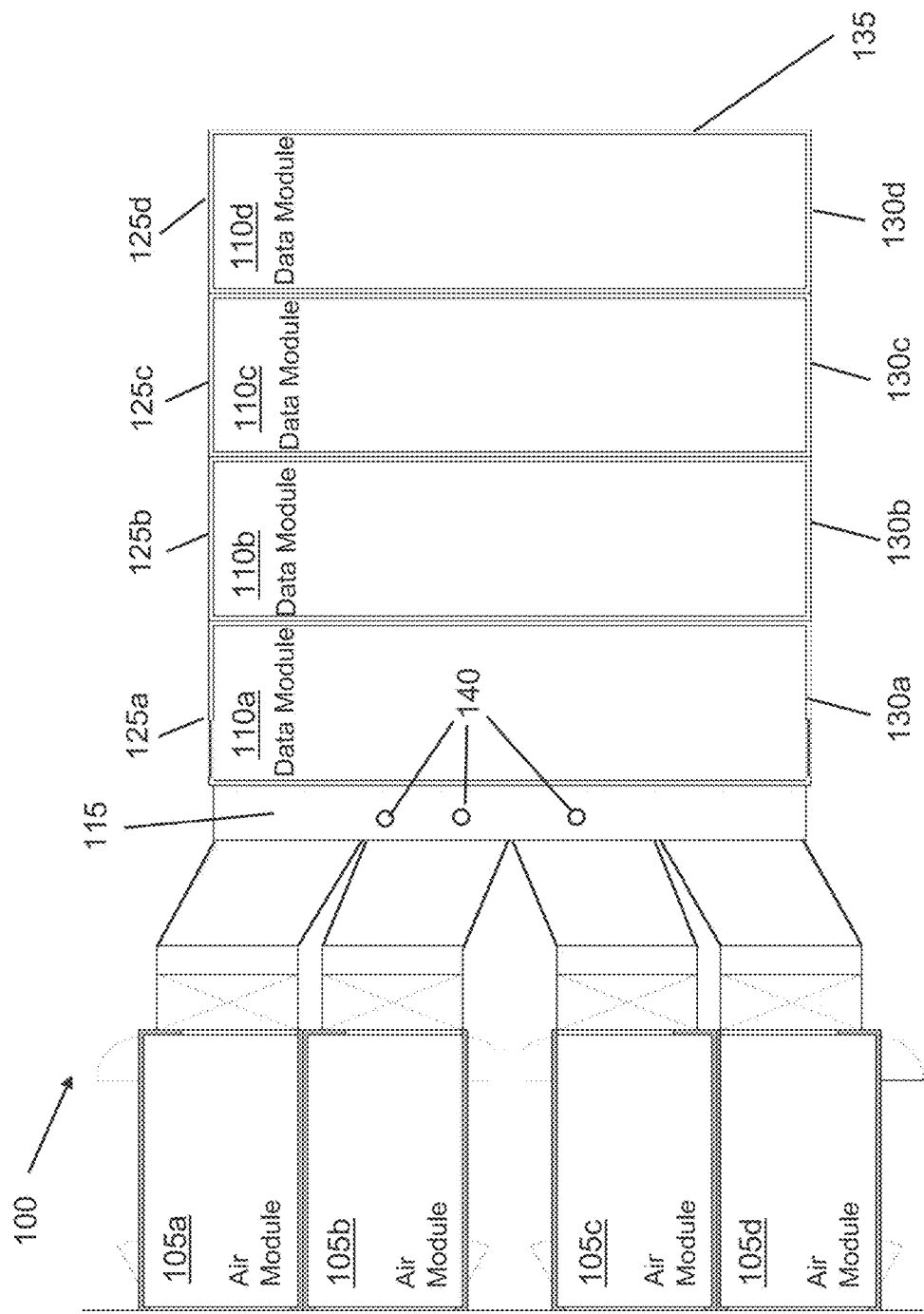
FIG. 1A depicts a top view of a data center.

FIG. 1A depicts a top view of data center 100. Data center 100 includes air modules 105a-105d (generally air modules 105). Air modules 105 are connected to data modules 110a-110d via supply air conduit 115. Supply air conduit 115 can be pipes, ducts, or any other conduit for carrying air between air modules 105 and data modules 110.

Figure 1B:
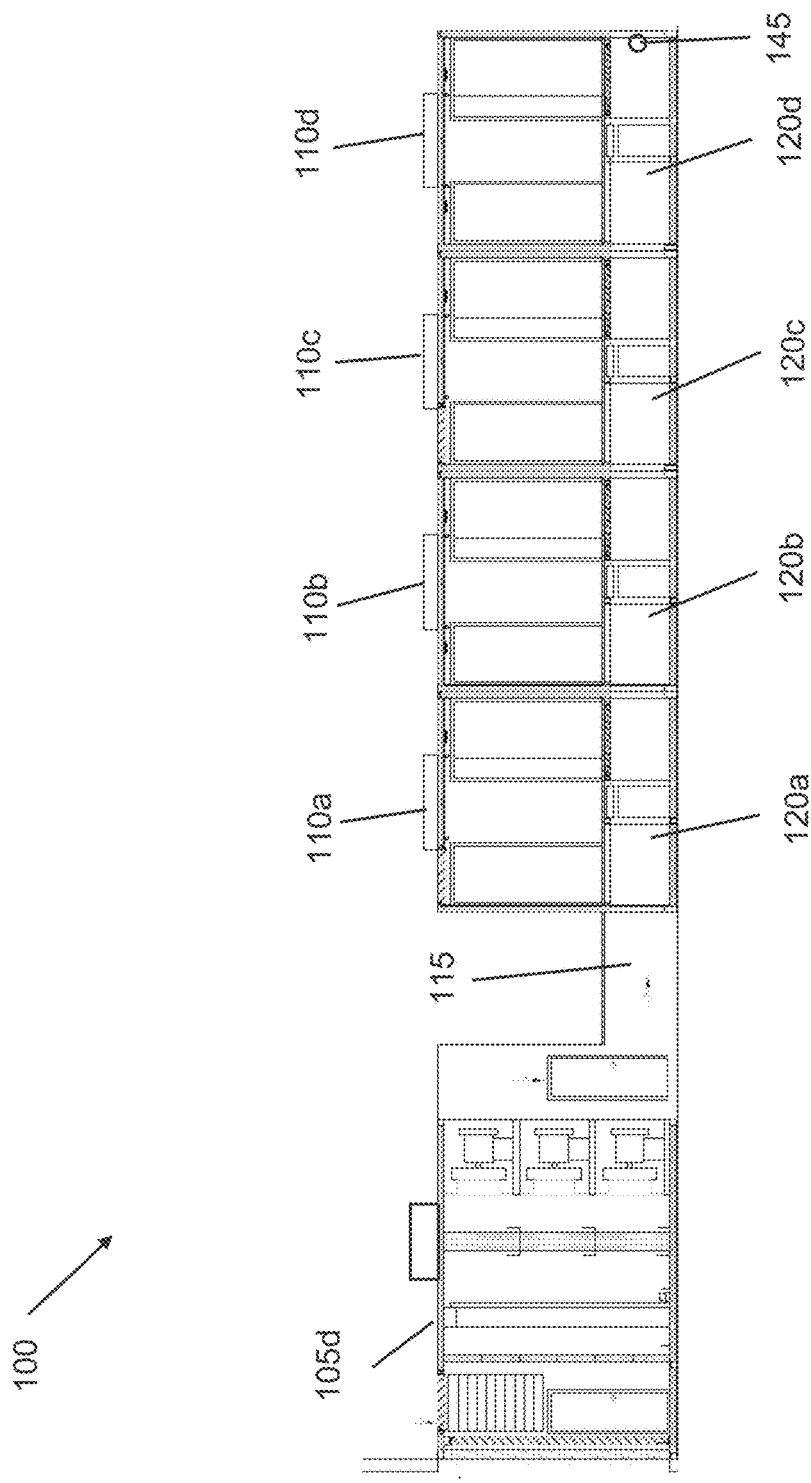
FIG. 1B depicts a side view of a data center.

FIG. 1B depicts a side view of data center 100. As illustrated, air module 105d connects to supply air conduit 115. Supply air conduit 115 connects to sub-floor space 120a of data module 110a. Sub-floor space 120a of data module 110a connects to sub-floor space 120b of data module 110b. Sub-floor space 120b of data module 110b connects to sub-floor space 120c of data module 110c. Sub-floor space 120c of data module 110c connects to sub-floor space 120d of data module 110d. In the illustrated configuration, sides 125, 130, and 135 of sub-floor spaces 120 are closed, forming a plenum consisting of sub-floor space 120a-120d.

Air modules 105 can provide supply air to data modules 110 via supply conduit 115. In some embodiments, air modules 105 pressurize the supply air in supply air conduit 115 and sub-floor spaces 120, creating a pressure differential between the air pressure in the supply air conduit 115/sub-floor spaces 120 and the surrounding environment. The pressure differential can cause air (e.g., supply air) to flow from air modules 105 to data modules 110, air to flow through data modules 110, and air to flow from data modules 110 to the surrounding environment.

Data center 100 is an exemplary data center utilizing the disclosed technology. Other configurations are contemplated. For example, the number of air modules and data modules can be increased or decreased depending on the amount of cooling required by IT equipment. As another example, air modules and data modules can be placed outdoors.

Figure 2:
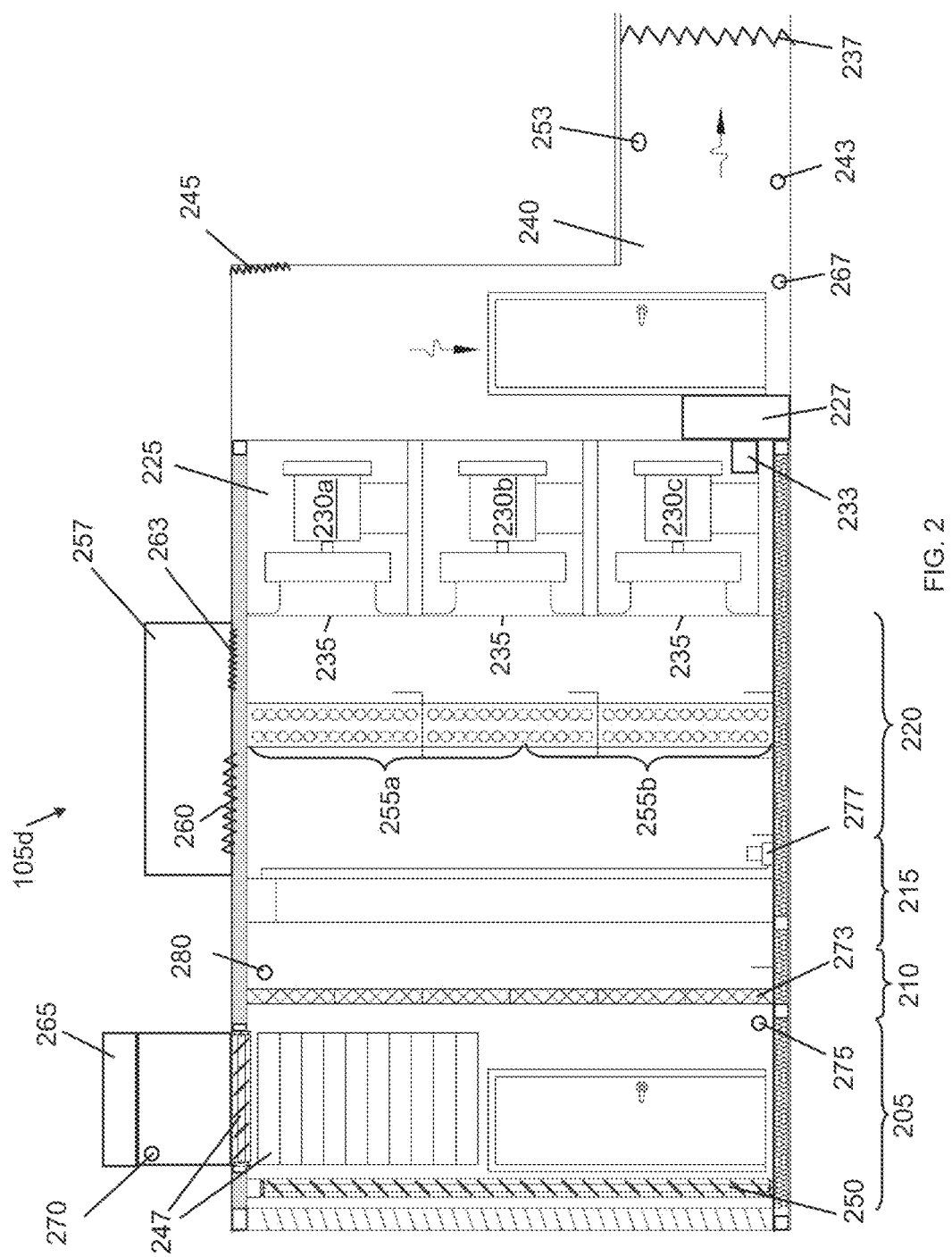
FIG. 2 depicts a side view of an air module.

FIG. 2 depicts a side view of air module 105d. It should be appreciated that air modules 105a-105c can have similar configurations and functionality as air module 105d. Air module 105d includes air intake module 205, filtration module 210, evaporative cooling module 215, DX cooling module 220, and fan array 225. Return air can enter the air module 105d through return air intake damper 247, and outside air can enter the air module 105d through outside intake damper 250. Air module 105d includes controller 227. Controller 227 can control the operation of air module 105d, as will be described in greater detail below.

In various embodiments, controller 227 may execute logic to evaluate conditions and determine instructions for assessing and controlling data center operating conditions. In various embodiments, a data center intelligent control system (a "DCICS") is a computer-based software system that gathers and analyzes data, generates instructions and communicates instructions to the controller. The DCICS optimizes data centers and data center operations by, for example: collecting, monitoring, analyzing, warehousing and mining data; analyzing and predicting using proprietary algorithms, forecasts, simulations, and models to develop alternative data center configurations and processes; optimizing by analyzing a plurality of optimization dimensions and developing and evaluating alternative optimization actions; and generating and implementing optimization instructions.

Various embodiments of this disclosure include the DCICS monitoring, analyzing and controlling data centers and related hardware and software, for example, by exchanging data with a controller (e.g. controller 227) and/or sending control instructions to a controller. In various embodiments, a DCICS determines, based upon a first expression, a first operation and data collection points associated with data center assets. Data collection points may include sensors, indicators, detectors, application programming interfaces, system data, etc. In various embodiments, the expression may be obtained from a data base, a user interface, another system, a hardware device, etc. DCICS interprets and/or analyzes the expression and generates machine code instructions, executes the machine code instructions to produce a result of the first operation. examines or analyzes the result and determines a control instruction, and at least one of executes the control instruction, partially executes the control instruction, and/or communicates the control instruction to a controller, a hardware device or software program for execution. More information regarding, DCICS and related software applications, can be found in U.S. patent application Ser. No. 13/788,834 filed on Mar. 7, 2013 and entitled "DATA CENTER INTELLIGENT CONTROL AND OPTIMIZATION," the contents of which are hereby incorporated by reference it its entirety.

In some embodiments, one or more of air modules 105 can be in operating mode, and one or more of air modules 105 can be in a standby mode. The controllers in each air module (e.g., controller 227 in air module 105d) can negotiate to determine the operating/standby state of each air module. Air modules 105 that are in standby mode can be switched to operating mode by their controllers. In some embodiments where one or more of air modules 105 are in standby mode, the operating/standby mode of each air module 105 can be rotated on a periodic basis (e.g., monthly) to exercise and equalize runtime of air modules 105. In the event that one of air modules 105 fails, another one of air modules 105 can be changed from standby to operating mode.

In some embodiments, if one or more of air modules 105 in operating mode fail, the remaining air modules 105 in operating mode can increase conditioned air output to compensate for the one or more of air modules 105 that fail.

Fan Array Operation

Fan array 225 can include blowers 230. Blowers 230 can be arranged in a matrix (e.g., a 3×3 matrix of blowers). The speed of blowers 230 (e.g., how fast the fan blade in each blower rotates) can be controlled by variable frequency drive (VFD) 233. Controller 227 can send a signal to VFD 233 to increase or decrease the speed at which blowers 230 operate. Each of blowers 230 can include backdraft dampers 235. In some embodiments, a VFD can be included for each blower.

In some embodiments, controller 227 can cause VFD 233 for fan array 225 to start blowers 230. Controller 227 can open discharge/supply damper 237 when the blowers 230 are running. Controller 227 can monitor the open/closed position of discharge/supply damper 237. Controller 227 can report a discharge damper alarm condition if discharge/supply damper 237 fails to open or close when instructed to by controller 227.

In some embodiments, each blower 230 includes a piezometer ring sensor and CFM transducer (collectively CFM sensor) for measuring air flow through each blower 230. Controller 227 can monitor the airflow rate (e.g., in CFM) of each blower 230 using the CFM sensor. Controller 227 can adjust the speed of blowers 230 using VFD 233 to maintain a desired total airflow rate at the discharge/supply duct 240 of air module 105d. In some embodiments, all of blowers 230 can operate at the same speed. In some embodiments, some of blowers 230 can operate at different speeds than others of blowers 230.

As illustrated, data center 100 of FIG. 1A can include static pressure sensors 140 in supply air conduit 115 to measure static air pressure at the location of static pressure sensors 140. Controller 227 can monitor static pressure in supply air conduit 115 via static pressure sensors 140. In some embodiments, static pressure sensors 140 can be used for redundancy. In the event that one of static pressure sensors 140 reports a static pressure significantly different than the other static pressure sensors 140, controller 227 can report a failed sensor alarm and disregard the output of the failed static pressure sensor 140.

In some embodiments, Controller 227 can set an airflow setpoint for fan array 225, causing blowers 230 to maintain airflow at or about the airflow setpoint, in order to maintain a desired static pressure in supply air conduit 115 (e.g., the pressure setpoint can be 0.5 to 1.5 IWG).

As illustrated, data center 100 of FIG. 1B can include closing plate static pressure sensor 145. Closing plate static pressure sensor 145 can be placed in the sub-floor space of the data module furthest from the air module (e.g., subfloor space 120d of data module 110d). Controller 227 can monitor the static pressure in subfloor space 120d via closing plate static pressure sensor 145. Controller 227 can send an alarm if the static pressure at the location of the closing plate static pressure sensor 144 falls below a predetermined static pressure (e.g., 0.5 IWG).

In some embodiments, if the static pressure measured by supply static pressure sensor 243 in discharge/supply duct 240 exceeds a predetermined static pressure setpoint (e.g., 3.0 IWG), relief damper 245 (e.g., an adjustable barometric relief damper) can open to relieve excess supply air into the surrounding environment to protect air module 105d, supply air conduit 115, and other aspects of data center 100.

In some embodiments, upon detecting a loss of airflow at any of blowers 230 via the CFM sensor, controller 227 can report a blower failure alarm. Backdraft damper 235 on failed blower 230 can automatically close to prevent reverse airflow through failed blower 230. Controller 227 can signal VFD 233 to increase the speed of the remaining operating blowers 230 to maintain the required total CFM discharged by fan array 225.

In some embodiments, controller 227 can monitor the status of VFD 233 and the amperage draw of fan array 225 via the VFD 233. Upon detecting a failure of VFD 233, controller 227 can report a VFD failure alarm, switch VFD 233 into bypass mode, and energize a sufficient number of blowers 230 at full speed to maintain the required total CFM discharged by fan array 225.

In some embodiments, if fan array 225 cannot deliver a predetermined minimum airflow rate, air module 105d can be considered "failed." Controller 227 can report an airflow failure alarm, deenergize air module 105d (e.g., shut down air intake module 205, filtration module 210, evaporative cooling module 215, DX cooling module 220, and fan array 225), close discharge/supply damper 237, close return air intake dampers 247, close outside air intake damper 250, and/or change one of air modules 105 that is in standby mode to operating mode.

In some embodiments, upon detecting smoke in discharge/supply duct 240 via smoke detector 253, smoke detector 253 can report the presence of smoke (e.g. an alarm can be reported to a building fire alarm system). Controller 227 can report a smoke detection warning, close outside air intake damper 250, and open return air intake dampers 247 to determine whether the smoke is coming from the outside air. If after a pre-determined amount of time (e.g., 30 seconds), smoke detector 253 continues to detect smoke, controller 227 can report a smoke shutdown alarm, deenergize air module 105d, close discharge/supply damper 237, close return air intake dampers 247, close outside air intake damper 250, and/or change one of air modules 105 that is in standby mode to operating mode.

Mechanical Refrigeration

As described above, air module 105d can include DX cooling module 220. In some embodiments, DX cooling modules can be fluid based (e.g., coolant, etc.). In some embodiments, any mechanical refrigeration can be used (e.g., chilled water-based mechanical refrigeration). As illustrated in FIG. 2, DX cooling module 220 includes coil bank 255a and coil bank 255b. Each coil bank 255 can include two coil circuits. A first condenser (not shown) can supply coil bank 255a with coolant (e.g., provide mechanical refrigeration for coil bank 155a) and a second condenser (not shown) can supply coil bank 255b with coolant (e.g., provide mechanical refrigeration for coil bank 155b).

Upon determining a need for mechanical refrigeration, as described below, controller 227 can enable the first and second condensing units (e.g., in sequence or approximately simultaneously).

Controller 227 can monitor conditions at each condensing unit via a communication interface (e.g., MODBUS). For example, controller 227 can monitor the following conditions at each condensing unit: Saturated suction temperature (SST) for each coil circuit, discharge pressure for each coil circuit, suction pressure for each coil circuit, compressor on-off status, and condensing unit alarm state. In some embodiments, if a condensing unit is in an alarm state, controller 227 can report a condensing unit failure.

Controller 227 can set a leaving air temperature set point for each of coil banks 255. In some embodiments, the leaving air temperature set point can be determined as described below. In some embodiments, an integral microprocessor controller in each condensing unit can cycle the refrigerant liquid line solenoid valves, and sequence the operation of the compressors and condenser fans, to maintain leaving air at the leaving air temperature set point.

In some embodiments, upon the SST of the refrigerant in a coil bank 255 exceeding a predetermined maximum allowable SST (e.g., 54° F.) for more than a predetermined amount of time (e.g., 10 minutes), controller 227 can gradually lower the leaving air temperature set point until the SST is at or below the maximum allowable SST.

In some embodiments, air module 105d includes cooling coil bypass 257. Cooling coil bypass 257 can be a duct, pipe, or other conduit. In the illustrated embodiment, cooling coil bypass 257 permits air to bypass coil banks 255 (e.g., not pass through and/or be cooled by coil banks 255). Air module 105d can include actuated bypass damper 260. In some embodiments, controller 227 can control the opening and closing of actuated bypass damper 260. Air module 105d can include bypass damper 263.

In some embodiments, controller 227 can control actuated bypass damper 260 to mix non-refrigerated air (e.g., air that does not pass through coil banks 255) with refrigerated air (e.g., air that passes through coil banks 255) to maintain a supply air temperature in discharge/supply duct 240 at a predetermined supply air temperature (e.g., 75° F.). Supply temperature and humidity sensor 267 can measure the temperature of supply air in discharge/supply air duct 240. Controller 227 can monitor the position (e.g., amount open) of actuated bypass damper 260 and can report a damper failure alarm if the position of actuated bypass damper 260 deviates from the position instructed by controller 227.

In some embodiments, actuated bypass damper 260 is not opened beyond a point where a differential static pressure across cooling coil banks 255 falls below a predetermined pressure (e.g., 0.30 IWG), which can correspond to a face velocity across coil banks 255.

If actuated bypass damper 260 is open to the coil face velocity limit (e.g., differential static pressure across cooling coil banks 255 is at the limit above), and the air temperature in discharge/supply duct 240 falls below the predetermined supply air temperature (e.g., 75° F.), controller 227 can activate return air duct heater 265. In some embodiments, return air duct heater 265 can include 5 heating cycles, with each heating cycle providing increased heating. Controller 227 can modulate the first stage of return air duct heater 265, and can cycle stages 2 thru 5, in sequence, as required to maintain the supply air temperature at the predetermined supply air temperature (e.g., 75° F.). In some embodiments, if return air duct heater 265 fails to operate (e.g., as sensed by a current transformer on the power leads of return air duct heater 265), controller 227 can report an electric heater failure alarm.

In some embodiments, if controller 227 senses via supply temperature and humidity sensor 267 in discharge/supply duct 240 a supply air dry-bulb temperature in excess of a predetermined maximum temperature (e.g., 78° F.) for more than a predetermined amount of time (e.g., 15 minutes), indicating a cooling system failure, controller 227 can report a high supply air temperature alarm, deenergize air module 105d, close discharge/supply damper 237, close return air intake dampers 247, close outside air intake damper 250, and/or change one of air modules 105 that is in standby mode to operating mode.

In some embodiments, if controller 227 senses via supply temperature and humidity sensor 267 in discharge/supply duct 240 a supply air dry-bulb temperature below a predetermined minimum temperature (e.g., 68° F.) for more than a predetermined amount of time (e.g., 15 minutes), indicating a failure of the module to limit the amount of cooling, controller 227 can report a low supply air temperature alarm, deenergize air module 105d, close discharge/supply damper 237, close return air intake dampers 247, close outside air intake damper 250, and/or change one of air modules 105 that is in standby mode to operating mode.

Controller 227 can compute the supply air dew point temperature (or "dew point") in discharge/supply duct 240. For example, controller 227 can use the atmospheric pressure at the location of data center 100 and the supply air dry-bulb temperature and relative humidity, as determined by supply temperature and humidity sensor 267. If a supply air dew point temperature is below a predetermined minimum dew point temperature (e.g., 35° F. DP), indicating a humidification failure, controller 227 can report a low supply air dew point temperature alarm, deenergize air module 105d, close discharge/supply damper 237, close return air intake dampers 247, close outside air intake damper 250, and/or change one of air modules 105 that is in standby mode to operating mode.

If a supply air dew point temperature is above a predetermined maximum dew point temperature (e.g., 62° F. DP), indicating an evaporative cooler control failure, controller 227 can report a high supply air dew point temperature alarm, deenergize air module 105d, close discharge/supply damper 237, close return air intake dampers 247, close outside air intake damper 250, and/or change one of air modules 105 that is in standby mode to operating mode.

Evaporative Cooling/Humidification Module

Evaporative cooling module 215 can include multiple (e.g., 5) evaporative cooling stages. In some embodiments, the greater number of stages enabled can result in greater evaporative cooling of air. Controller 227 can enable and disable evaporative cooling module 215. In some embodiments, controller 227 can control the number of enabled or active stages of evaporative cooling module 215. An integral controller within evaporative cooling module 215 can start the recirculation pump, energize the UV water sterilization system, control the make-up water solenoid valve, cycle the drain valve (based on conductivity), and open the required quantity of staging manifold valves to enable evaporative cooling stages.

Controller 227 can monitor the evaporative cooling module 215 via a communication interface (e.g., MODBUS). For example, controller 227 can monitor: open-closed position of each manifold valve, high reservoir level alarm, pump on-off status, and water conductivity. Upon sensing high reservoir level, pump failure, or excessive water conductivity, controller 227 can send a high reservoir level alarm or a pump failure alarm.

In some embodiments, controller 227 can sense via leak detector 277 for water on the floor of air module 105d and can send a water-on-floor alarm.

Modes of Operation

Air modules 105 can operate in different modes based on various environmental conditions. In some embodiments, air modules 105 can operate with greater efficiency by operating in different modes. As described in greater detail below, return air and outside air can be selectively mixed to form intake air and/or supply air. Evaporative and/or mechanical cooling can be applied to intake air to form supply air.

In some embodiments, as discussed below, the controller 227 can apply one or more tests or logic functions to select the appropriate mode for mixing and cooling intake air to form supply air based on one or more parameters, including return air temperature (Tradb) (e.g., air that air module 105d intakes through return air intake dampers 247), outside air temperature (Tosadb) (e.g., air that air module 105d intakes through return air intake dampers 250), dew point temperature of the outside air (Tosadp), and dew point temperature of the return air (Tradp). The return air temperature (Tradb) and dew point temperature of the return air (Tradp) may be measured or calculated in any suitable manner, including by return air temperature and humidity sensor 270 (FIG. 2). Similarly, the outside air temperature (Tosadb) and dew point temperature of the outside air (Tosadp) may be measured or calculated in any suitable manner, including by a temperature and humidity sensor at the outside air intake damper 250 and/or intake temperature and humidity sensor 275. Additional parameters, described below, used for selecting the mode of operation can be measured with sensors or calculated by the controller 227 using thermodynamic functions, curves, and limits.

In some embodiments, controller 227 can estimate the temperature rise across fan array 225 (e.g., the amount fan array 225 increases the temperature of air flowing through it) based on a total fan motor power of blowers 230 and an air density ratio at the location of data center 100 as follows:

TRfdb=Temperature Rise Across Fan Array

TRfdb=Kwfanarray×3413/(1.08×ADR×CFMfanarray)

Where:

Kwfanarray=Measured Total Fan Motor Power of blowers 230 in KW

ADR=Air Density Ratio at the Site Altitude

ADR=Paltitude/14.696

Paltitude=Standard Atmospheric Pressure at Site Altitude

Paltitude=14.696 (−16.8754×10−6Z) 5.2559

Z=Site Altitude in Feet Above Sea Level

CFMfanarray=Summation of the Measured Airflow from each Operating motor of blowers 230 in fan array 225

In some embodiments, controller 227 can maintain the temperature of the air entering fan array 225 at the predetermined supply air temperature (e.g., 75° F.) minus the fan array temperature rise as follows:

Tefdb=Dry Bulb Temperature of Air Entering fan array 230

Tefdb=Module Supply Air Temperature−TRfdb, or

Tefdb=75° F.−TRfdb

Low Return Air Temperature Recirculation Mode

In some embodiments, when the return air temperature (Tradb) is less than, or equal to, Tefdb, controller 227 can fully open return air intake dampers 247 and fully close outside air intake damper 250. Controller 227 can modulate the first stage of return air duct heater 265, and/or can cycle stages 2 thru 5, in sequence, to maintain an average air temperature equal to Tefdb downstream of air filters 273. If return air duct heater 265 fails to operate (e.g., as sensed by a current transformer on the power leads of return air duct heater 265 power leads), controller 227 can report an electric heater failure alarm. Controller 227 can disable evaporative cooler module 215 and close the solenoid valves in evaporative cooling module 215.

Airside Economizer without Humidification or Evaporative Cooling

In some embodiments, when the return air temperature (Tradb) is greater than Tefdb, the outside air temperature (Tosadb) is less than or equal to Tefdb, the dew point temperature of the outside air (Tosadp) does not exceed a predetermined high dew point setpoint (DP_UL) (e.g., 59° F.), and the dew point temperature of the outside air (Tosadp) is not less than a predetermined low dew point setpoint (DP_LL) (e.g., 41.9° F.), controller 227 can mix outside air with return air to achieve a mixed air temperature equal to Tefdb as sensed by intake air temperature and humidity sensor 275. If necessary, controller 227 can enable the DX cooling module 220. Controller 227 can disable evaporative cooling module 215 and close the solenoid valves in evaporative cooling module 215. Controller 227 can disable return air duct heater 265.

Airside Economizer with Humidification

In some embodiments, when the return air temperature (Tradb) is greater than Tefdb, the temperature of the outside air (Tosadb) is less than or equal to the return air temperature (Tradb), the dew point temperature of the outside air is less than a predetermined low dew point setpoint (DP_LL) (e.g., 41.9° F.), and the wet bulb temperature of the outside air (Tosawb) is less than or equal to Tllwb, controller 227 can mix outside air with return air to achieve a lower limit mixed air enthalpy entering evaporative cooling module 215 corresponding to Tefdb at a dew point temperature of the predetermined low dew point setpoint (e.g., 41.9° F.), as sensed by intake air temperature and humidity sensor 275. Where:

Tllwb=Lower Limit of Outside Air Wet Bulb Temperature for Evaporative Cooling, Psychrometrically Calculated at Tefdb with a predetermined low dew point setpoint (e.g., 41.9° F.)

Controller 227 can provide humidification as follows:

a) Controller 227 can predict wet bulb temperature of the mixed air entering evaporative cooling module 215 using the following formulas:

Tmadb=Desired Mixed Air Dry Bulb Temperature Entering the evaporative cooling module 215

Tmadb=Tosadb+((Tradb−Tosadb)(hll−hosa)/(hra−hosa))

Wma=Wosa+((Wra41.9−Wosa)×(Tmadb−Tosadb)/(Tradb−Tosadb))

Tmawb=Psychrometrically Calculated Wet Bulb Temperature of the Mixed Air, at Tmadb and Wma Where:
Tosadb=Outside Air Dry Bulb Temperature
Tosawb=Outside Air Wet Bulb Temperature
Tradb=Return Air Dry Bulb Temperature
RHosa=Outside Air Relative Humidity
RHra=Return Air Relative Humidity
hosa=Psychrometrically Calculated Enthalpy of the Outside Air, at Tosadb and RHosa
hll=Psychrometrically Calculated Lower Limit Enthalpy of Mixed Air Air at Tefdb and 41.9° F. Dew point Temperature
hra=Psychrometrically Calculated Enthalpy of the Return Air at Tradb and RHra
Wma=Predicted Humidity Ratio of the Mixed Air Entering the evaporative cooling module 215
Wosa=Psychrometrically Calculated Humidity Ratio of the Outside Air, at Tosadb and RHosa
Wra41.9=Psychrometrically Calculated Humidity Ratio of the Return Air, at Tradb and, e.g., 41.9° F. Dew point Temperature b) Controller 227 can predict temperature possible through an active stage of evaporative cooling, assuming 80% efficiency, using the following formula:

Tevapdb=Tmadb−(0.80×(Tmadb−Tmawb))

Where:
Tevapdb=Predicted Dry Bulb Temperature Leaving an Active Evaporative Cooler Stage c) Controller 227 can predict the number of active evaporative cooling stages required, assuming a total of 5 stages of evaporative cooling, to achieve a leaving air dry bulb temperature equal to Tefdb using the following formula:

Evapfracdb=Calculated Fraction of Airflow Through evaporative cooling module 215 to Maintain Tefdb ° F.

Evapfracdb=(Tmadb−Tefdb)/(Tmadb−Tevapdb)

Stagesdb=Quantity of Evaporative Cooler Stages Required Based on Dry Bulb Temperature Stagesdb=(Evapfracdb×5) Rounded Up to Nearest Whole Number, But Cannot Exceed 5

Controller 227 can determine the required number of evaporative cooler stages to use by the following formula:

Stages=Calculated Number of Evaporative Cooler Valves to Open (Stages of Evaporative Cooler to Energize)

Stages=Stagesdb, but not less than 0 e) Controller 227 can enable evaporative cooling module 215 and engage the quantity of evaporative cooler stages calculated above.

f) Controller 227 can mix outside air with return air to achieve a mixed air temperature equal to Tefdb as sensed by intake air temperature and humidity sensor 275.

g) Controller 227 can enable the DX cooling module 220, if necessary.

Airside Economizer with Supplemental Evaporative Cooling

In some embodiments, when the return air temperature (Tradb) is greater than Tefdb, the temperature of the outside air (Tosadb) is greater than Tefdb, the wet bulb temperature of the outside air (Tosawb) is less than Tulwb, the dew point temperature of the outside air (Tosadp) does not exceed a predetermined high dew point setpoint (DP_UL) (e.g., 59° F.), and the wet bulb temperature of the outside air (Tosawb) is greater than Tllwb, controller 227 can fully open outside air intake damper 250 and fully close return air intake dampers 247.

Where:
Tulwb=Upper Limit of Outside Air Wet Bulb Temperature for Evaporative Cooling, Psychrometrically Calculated at Tradb with a predetermined high dew point setpoint (e.g., 59° F.)

dew point a) Controller 227 can predict the temperature possible through an active stage of the evaporative cooling module 215, assuming 80% efficiency, using the following formula:

Tevapdb=Tosadb−(0.80×(Tosadb−Tosawb))

Where:
Tevapdb=Predicted Dry Bulb Temperature Leaving an Active Evaporative Cooler Stage
Tosadb=Outside Air Dry Bulb Temperature Entering the evaporative cooling module 215
Tosawb=Outside Air Wet Bulb Temperature Entering the evaporative cooling module 215 b) Controller 227 shall predict the number of active evaporative cooling stages required, assuming a total of 5 stages of evaporative cooling, to achieve a leaving air dry bulb temperature equal to Tefdb using the following formula:

Evapfracdb=Calculated Fraction of Airflow Through evaporative cooling module 215 to Maintain Tefdb ° F.

Evapfracdb=(Tosadb−Tefdb)/(Tosadb−Tevapdb)

Stagesdb=Quantity of Evaporative Cooler Stages Required Based on Dry Bulb Temperature Stagesdb=(Evapfracdb×5) Rounded Down to Nearest Whole Number, But Cannot Exceed 5 c) Controller 227 can predict the number of active evaporative cooling stages required, assuming 5 stages of evaporative cooling, to limit the mixed air leaving air dew point temperature to a predetermined high dew point setpoint (e.g., 59° F.), using the following formula:

Evapfracw=Calculated Fraction of Airflow Through evaporative cooling module 215 to Limit Mixed Air Dew point Temperature to a predetermined high dew point setpoint (e.g., 59° F.)

Evapfracw=(Wosa−W59)/(Wosa−Wevap)

Where:

Wevap=Psychrometrically Calculated Humidity Ratio of the Air Leaving the Active Evaporative Cooler Stages, at Tevapdb and Tosawb Wosa=Psychrometrically Calculated Humidity Ratio of the Air Leaving the Inactive Evaporative Cooler Stages, at Tosadb and Tosawb W59=Psychrometrically Calculated Humidity Ratio at a predetermined high dew point setpoint (e.g., 59° F.)

Stagesw=Quantity of Evaporative Cooler Stages Required Based on Humidity Ratio

Stagesw=(Evapfracw×5) Rounded to Nearest Whole Number, But Cannot Exceed 5 d) Controller 227 can determine the appropriate number of evaporative cooling stages to use by the following formula:

Stages=Calculated Number of Evaporative Cooler Valves to Open (Stages of Evaporative Cooler to Energize)

Stages=Lessor of Stagesdb and Stagesw, but not less than 0 e) Controller 227 can predict the mixed air dry bulb temperature leaving the evaporative cooling module 215 when evaporatively cooled air passing though the active evaporative cooling stages is mixed with outside air passing through the inactive stages using the following formula:

Tmixdb=(Tevapdb×Stages/5)+(Tosadb×(5−Stages)/5)

f) Controller 227 can predict the mixed air humidity ratio leaving evaporative cooling module 215 when evaporatively cooled air passing though the active stages is mixed with untreated outside air passing through the inactive stages using the following formula:

Wmix=(Wevap×Stages/5)+(Wosa×(5−Stages)/5)

g) Controller 227 can enable the evaporative cooler module and open the quantity of evaporative cooler stage valves calculated above.

h) Controller 227 can enable the DX cooling module 220, if necessary.

High Ambient Dew Point or Wet Bulb, Sensible Refrigerated Cooling Mode

In some embodiments, if the dew point temperature of the outside air (Tosadp) is greater than a predetermined high dew point setpoint (DP_UL) (e.g., 59° F.) or if the wetbulb temperature of the outside air (Tosawb) is greater than or equal to Tulwb; and additionally, the dew point temperature of the return air (Tradp) is less than, or equal to, the predetermined high dew point setpoint (DP_UL) (e.g., 59° F.) and the return air temperature (Tradb) is greater than Tefdb, controller 227 can fully open return air intake dampers 247 and fully close outside air intake damper 250. Controller 227 can enable Mechanical Refrigeration as described above. Controller 227 can disable evaporative cooling module 215 and close the solenoid valves on all of the evaporative cooler stages.

High Ambient Dew Point, Dehumidification Mode

In some embodiments, if the dew point temperature of the outside air (Tosadp) is greater than a predetermined high dew point setpoint (DP_UL) (e.g., 59° F.) or the wetbulb temperature of the outside air (Tosawb) is greater than or equal to Tulwb; and additionally the dew point temperature of the return air (Tradp) is greater than the predetermined high dew point setpoint (DP_UL) (e.g., 59° F.), controller 227 can fully open return air intake dampers 247 and fully close outside air intake damper 250.

a) Controller 227 can enable the first condensing unit, if not already enabled, and can reset the leaving air temperature of coil bank 255a to maintain a leaving coil temperature of a predetermined temperature (e.g., 58° F.).

b) Controller 227 can control the second condensing unit, coil bank 255b, actuated bypass damper 260, and return air duct heater 265 as described above to maintain the supply air temperature at a predetermined supply air temperature (e.g., 75° F.).

c) Controller 227 can disable the evaporative cooling module 215, if not already disabled.

Airside Dry Return Air Recirculation with Humidification Mode

In some embodiments, if the dew point temperature of the outside air (Tosadp) is less than the predetermined low dew point setpoint (DP_LL) (e.g., 41.9° F.), the dew point temperature of the return air (Tradp) is less than the predetermined low dew point setpoint (DP_LL) (e.g., 41.9° F.), the temperature of the outside air (Tosadb) is greater than the return air temperature (Tradb), the return air temperature (Tradb) is greater than Tefdb, and the wet bulb temperature of the outside air (Tosawb) is less than Tllwb, controller 227 can enable one stage of the evaporative cooler module 215. Controller 227 can fully close outside air intake damper 250 and fully open return air intake dampers 247.

Evaporative Cooling with Dry Air Warmer than Return Air Mode

In some embodiments, if the temperature of the outside air (Tosadb) is greater than the return air temperature (Tradb), the dew point temperature of the return air (Tradp) is greater than or equal to the predetermined low dew point setpoint (DP_LL) (e.g., 41.9° F.), and dew point temperature of the outside air (Tosadp) is less than the predetermined low dew point setpoint (DP_LL) (e.g., 41.9° F.), controller 227 can mix outside air with return air to achieve a mixed air temperature equal to Tefdb as sensed by intake air temperature and humidity sensor 275. Controller 227 can enable the evaporative cooler module 215 and open the quantity of evaporative cooler stage valves calculated above. Controller 227 can enable the DX cooling module 220, if necessary In some embodiments, controller 227 can control gravity relief hoods (not shown) in the building housing data center 100. Controller 227 can modulate the dampers in the gravity relief hoods in conjunction with outside air intake damper 250 to manage the air pressure within the building housing data center 100. For example, the gravity relief hoods can be closed when outside air intake damper 250 is closed. The gravity relief hoods can be open when outside air intake damper 250 is open. Controller 227 can monitor the position of each damper in the gravity relief hoods and report a damper failure alarm for any damper position that deviates the position instructed by controller 227.

Air Filters

Controller 227 can monitor the differential pressure across air filters 273 via filter air pressure sensor 280. In some embodiments, if the differential pressure drops across air filters 273 by more than a predetermined amount (e.g. 0.75 IWG), controller 227 can send a dirty filter alarm.

Figure 3:
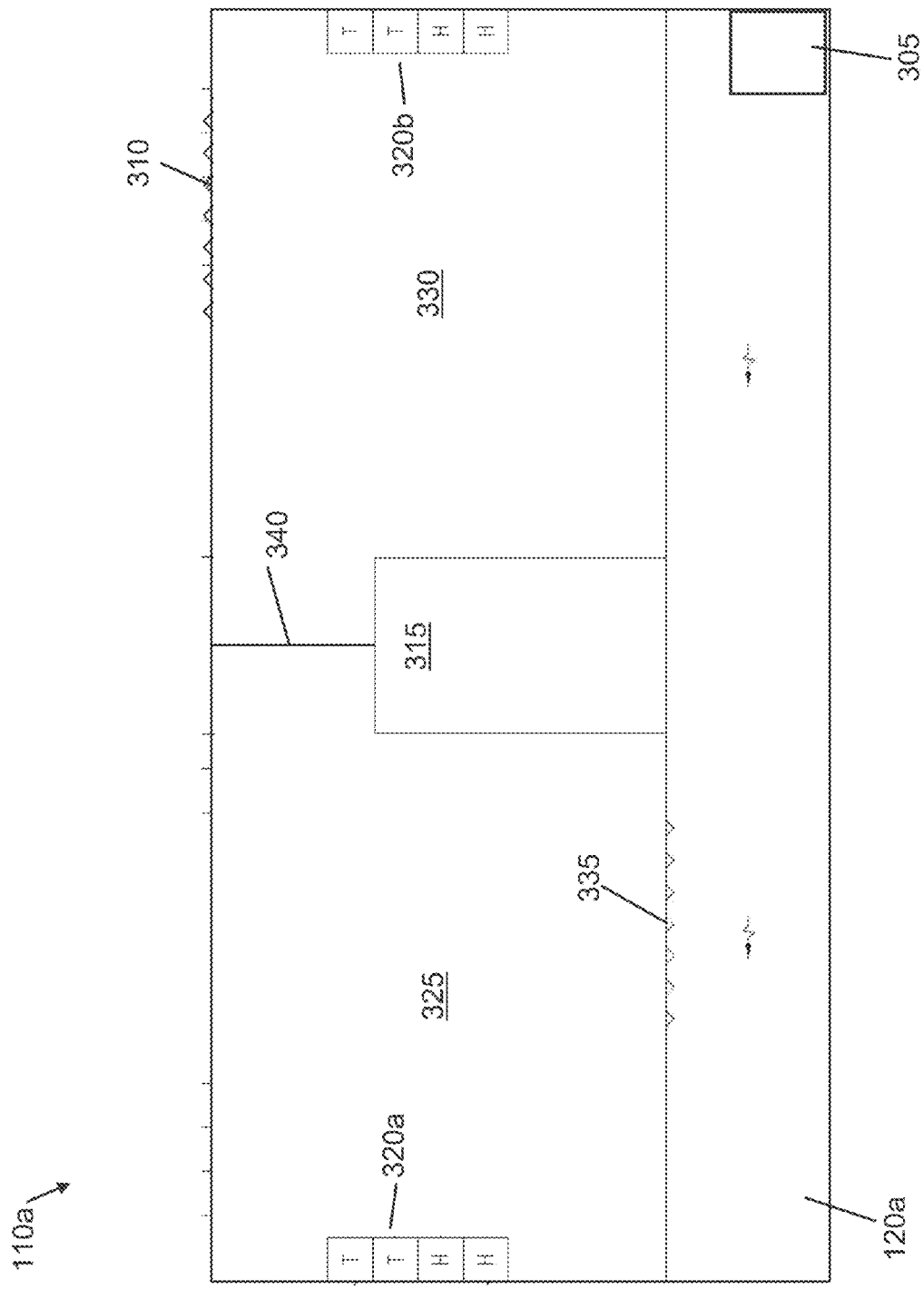
FIG. 3 depicts a side view of a data module.

FIG. 3 depicts a side view of data module 110a. A discussed above, air modules 105 can provide supply air to sub-floor space 120a, pressurizing sub-floor space 120a.

Damper Operation

In some embodiments, data module 110a includes controller 305. Controller 305 can open return air damper 310 when data module 110a is in use (e.g., when data module 110a contains running IT equipment 315). Controller 305 can monitor the position of return air damper 310 and report an alarm condition if it deviates from the position the position instructed by controller 305. Return air damper 310 can permit air to be exhausted from data module 110a into the surrounding environment.

In some embodiments, data module 110a can include temperature and humidity sensors 320a and 320b. In some embodiments, temperature and humidity sensors 320a can be in cold aisle 325. Temperature and humidity sensors 320b can be in hot aisle 330. Separator 340 can facilitate separating cold aisle 325 and hot aisle 330. In some embodiments, zones can be formed in cold aisle 325 or hot aisle 330. For example, a first half of cold aisle 325 can be designated as Zone A and include first temperature and humidity sensors 320a and a second half of cold aisle 325 can be designated as Zone B and include second temperature and humidity sensors 320a. Hot aisle 330 can include similar zones and temperature and humidity sensor placement. Controller 305 can modulate supply air damper 335 in zone A to maintain a hot aisle temperature of a predetermined hot aisle temperature setpoint (e.g., 100° F.) in Zone A. Controller 305 can modulate supply air damper 335 in Zone B to maintain a hot aisle temperature of a predetermined hot aisle temperature setpoint (e.g., 100° F.) in Zone B. In some embodiments, if the hot aisle temperature in Zone A or Zone B cannot be maintained at or below a predetermined hot aisle temperature setpoint (e.g., 100° F.) after fully opening supply air damper 335, controller 305 can report a cooling failure alarm.

In some embodiments, controller 305 can monitor the position of supply air damper 335 and report an alarm condition if it deviates from the position instructed by controller 305.

In some embodiments, if controller 305 fails, return air damper 310 and supply air damper 335 can fail in the last instructed position.

In some embodiments, controller 305 can monitor the cold aisle 335 temperature and humidity. If the temperature rises above a predetermined cold aisle maximum temperature setpoint (e.g., 78° F.), controller 305 can override the supply damper modulation and control it to bring the cold aisle 335 temperature to a predetermined cold aisle temperature set point (e.g., 75° F.). If the temperature remains above the predetermined cold aisle maximum temperature setpoint (e.g., 78° F.), controller 305 can report an alarm. In some embodiments, if the dew point temperature in cold aisle 325 or hot aisle 330 is above a maximum dew point setpoint (e.g., 59° F.) or below a minimum dew point temperature set point (e.g., 42° F.), controller 305 can report an alarm.

In some embodiments, if smoke is detected within data module 110a, controller 305 can report an alarm. Controller 110a can fully close return air damper 310 and supply air damper 335 before a clean agent is released from fire suppression tanks.

Figure 4:
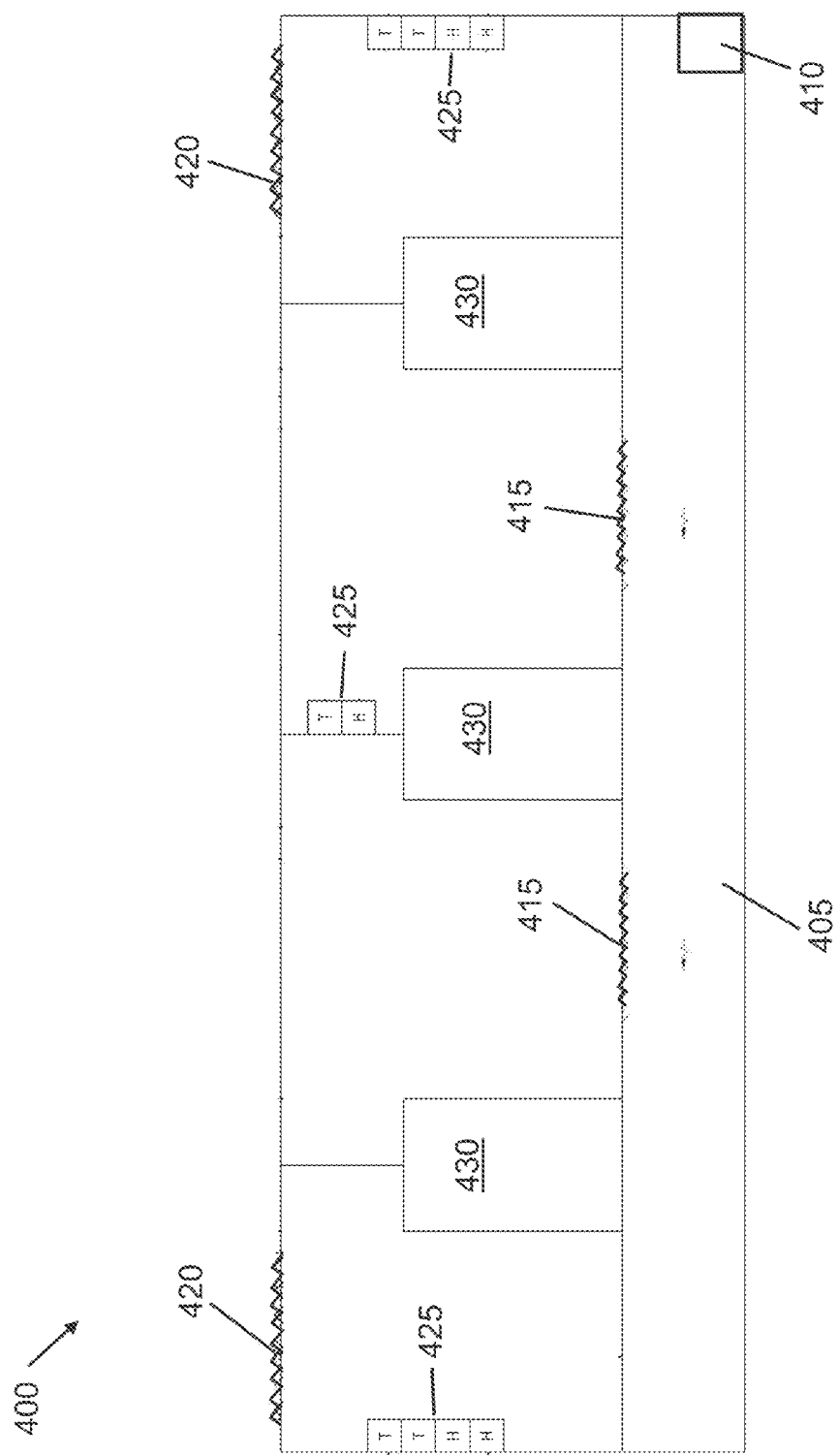
FIG. 4 depicts a side view of a data module.

FIG. 4 depicts a side view of data module 400. Data module 400 can be connected to an air module as described above with data modules 110. For example, data module 400 can receive supply air via sub-floor space 405. Controller 410 can modulate supply air dampers 415 and return air dampers 420 based on temperature and humidity sensors 425 as described above with respect to data module 110a.

Figure 5:
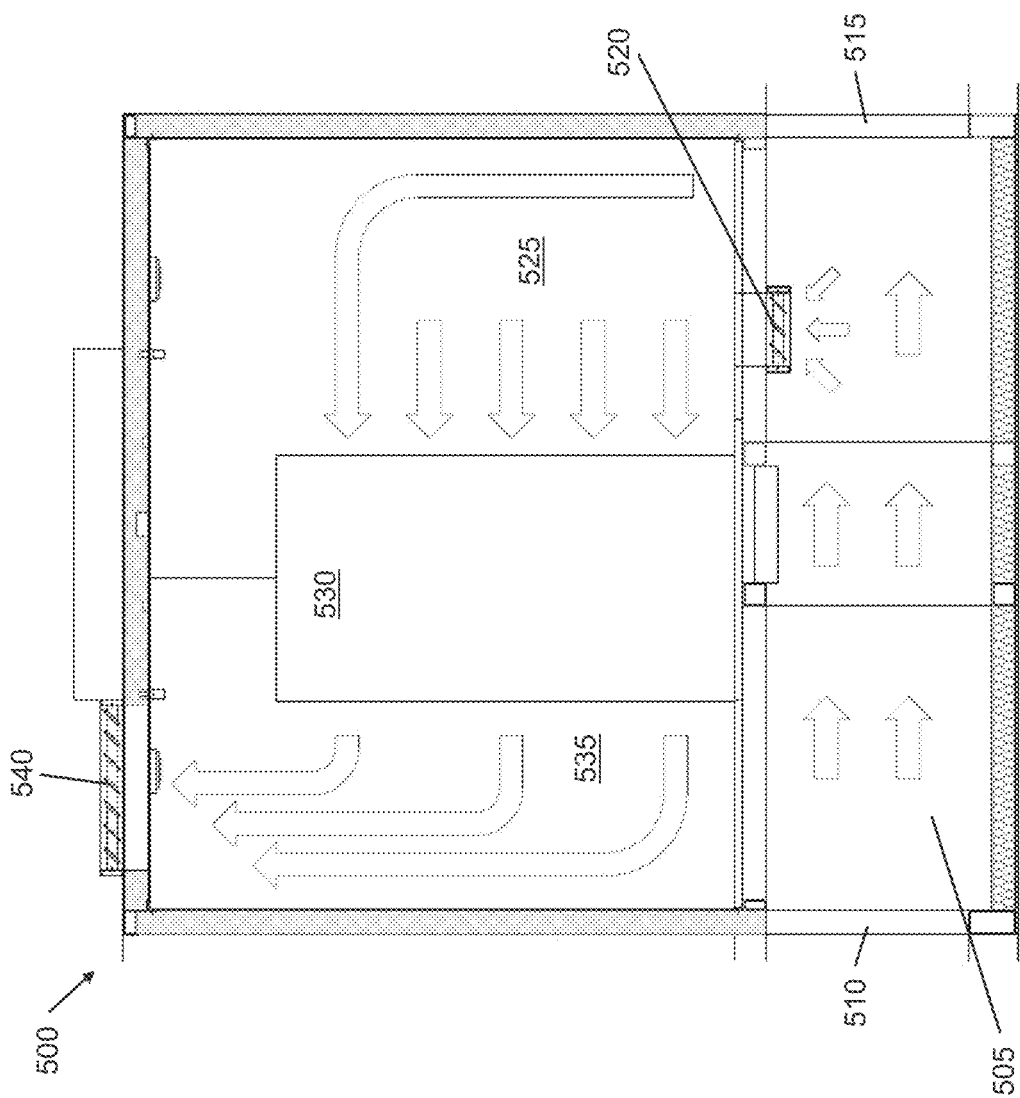
FIG. 5 depicts an exemplary air flow through a data module.

FIG. 5 depicts an exemplary air flow through data module 500. Supply air can be provided to sub-floor space 505 through air intake opening 510. Air intake opening 510 can be connected to, for example, supply air conduit 115 of FIG. 1A or another data module. A portion of supply air can flow out of subfloor space 505 through exit opening 515. Exit opening 515 can connect to the sub-floor space of another data module, thereby providing supply air to the data module. In some embodiments, data module 500 can be the last data module in the series of data modules receiving supply air from one or more particular air modules, and can have a closing plate in place of exit opening 515.

As described above, sub-floor space 505 can be pressurized by one or more air modules. A portion of the supply air can flow through supply air damper 520 into cold aisle 525 as a result of a pressure differential between sub-floor space 505 and cold aisle 525. Air can flow through IT equipment 530, removing heat from IT equipment 530, and into hot aisle 535. Air from hot aisle 535 can be exhausted through return damper 540.

Figure 6:
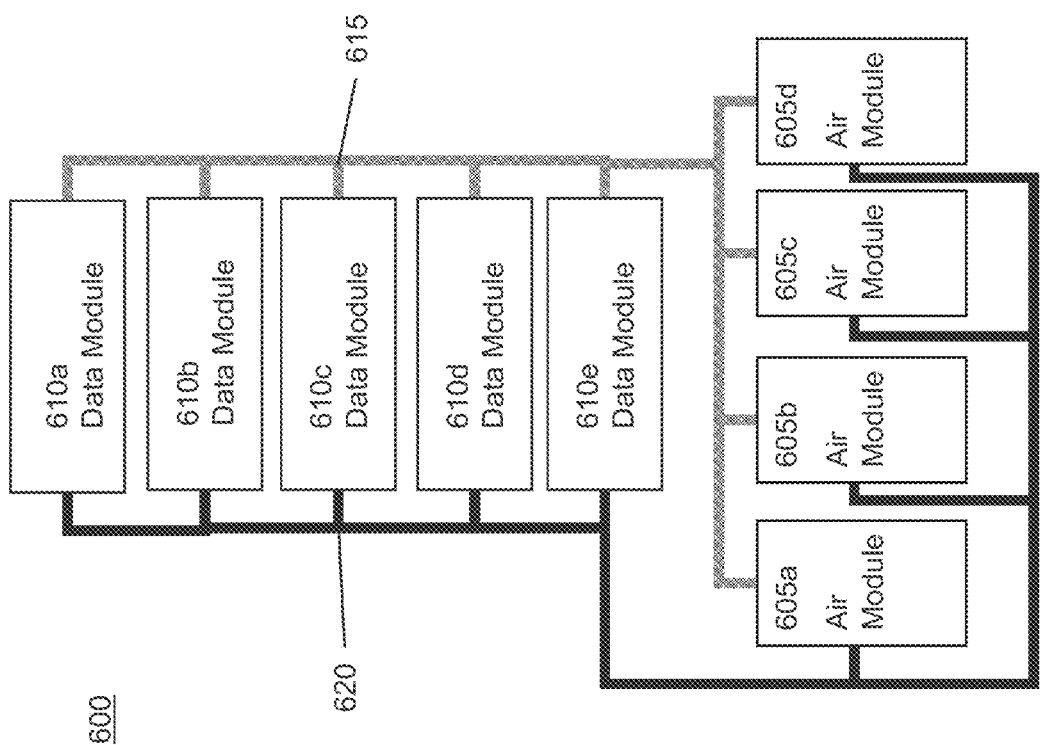
FIG. 6 depicts a top view of data center.

FIG. 6 depicts a data center 600. Data center 600 is a data center configuration in which the technology described herein can be utilized. Data center 600 includes air modules 605a-605d (generally air modules 605). Air modules 605 are connected to data modules 610a-610e via supply air conduit 615 and return air conduit 620. Supply air conduit 615 and return air conduit 620 can be pipes, ducts, or any other conduit for carrying air between air modules 605 and data modules 610. Air modules 605 can provide supply air to data modules 610 via supply conduit 615. Return air can be carried from data modules 610 to air modules 605 via return air conduit 620. In some embodiments, air modules 605 pressurize the supply air in supply air conduit 615, creating pressure differential between the air pressure in the supply air conduit 615 and the return air conduit 620. The pressure differential can cause air (e.g., supply air) to flow from air modules 605 to data modules 610, air to flow through data modules 610, and air (e.g., return air) to flow from data modules 610 to air modules 605. In some embodiments, air modules 605 and data modules 610 can operate as described above.

Method steps can be performed by one or more programmable processors executing a computer program to perform functions of the technology by operating on input data and generating output. Method steps can also be performed by, and apparatus can be implemented as, special purpose logic circuitry, e.g., an FPGA (field programmable gate array) or an ASIC (application-specific integrated circuit). Modules can refer to portions of the computer program and/or the processor/special circuitry that implements that functionality.

Processors suitable for the execution of a computer program include, by way of example, both general and special purpose microprocessors, and any one or more processors of any kind of digital computer. Generally, a processor receives instructions and data from a read-only memory or a random access memory or both. The essential elements of a computer are a processor for executing instructions and one or more memory devices for storing instructions and data. Generally, a computer also includes, or be operatively coupled to receive data from or transfer data to, or both, one or more mass storage devices for storing data, e.g., magnetic, magneto-optical disks, or optical disks. Data transmission and instructions can also occur over a communications network. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

The technology has been described in terms of particular embodiments. The alternatives described herein are examples for illustration only and not to limit the alternatives in any way. The steps of the technology can be performed in a different order and still achieve desirable results.

What is claimed is:

1. An air module comprising:
   a controller;
   an air intake module configured to receive first air from a first air source and to receive second air from a second air source;
   an evaporative cooling module in fluid communication with the air intake module;
   a mechanical cooling module in fluid communication with the evaporative cooling module; and
   wherein the controller is configured to:
      cause the intake module to mix, based on at least a supply air temperature set point, the first air and the second air to form intake air, and
      selectively cool the intake air to form supply air by at least one of causing the evaporative cooling module to selectively cool, based on at least the supply air temperature set point, the intake air, and causing the mechanical cooling module to selectively cool the intake air based on at least the supply air temperature set point.

2. The air module of claim 1, wherein the first air source is a source of return air, and wherein the second air source is a source of outside air.

3. The air module of claim 1, wherein the controller is further configured to:
   form the supply air substantially from the first air, if:
      a temperature of the first air is less than the supply air temperature set point.

4. The air module of claim 1, wherein the controller is further configured to:
   form the supply air by mixing the first air and the second air, if:
      a first temperature of the first air is greater than the supply air temperature set point,
      a second temperature of the second air is less than or equal to the supply air temperature set point, and
      a dew point of the second air is less than or equal to an upper limit of a dew point range and greater than or equal to a lower limit of the dew point range.

5. The air module of claim 1, wherein the controller is further configured to:
   form mixed air by mixing the first air and the second air, if:
      a first temperature of the first air is greater than the supply air temperature set point,
      a second temperature of the second air is less than the first temperature,
      a dew point of the second air is less than a lower limit of a dew point range, and
      a wet bulb temperature of the second air is less than or equal to a wet bulb temperature corresponding to the supply air temperature set point at the lower limit of a dew point range; and
   form the supply air by evaporatively cooling mixed air with the evaporative cooling module.

6. The air module of claim 1, wherein the controller is further configured to:
   form supply air substantially from the second air by evaporatively cooling the second air with the evaporative cooling module, if:
      a first temperature of the first air is greater than the supply air temperature set point,
      a second temperature of the second air is greater than the supply air temperature set point,
      a dew point of the second air is less than or equal to an upper limit of a dew point range, and
      a wet bulb temperature of the second air is within an evaporative cooling wet bulb temperature range.

7. The air module of claim 1, wherein the controller is further configured to:
   form supply air substantially from the first air by mechanically cooling the first air with the mechanical cooling module, if:
      a dew point of the second air is greater than an upper limit of a dew point range,
      a dew point of the first air is less than or equal to an upper limit of a dew point range, and
      a first temperature of the first air is greater than the supply air temperature set point; and
   form supply air substantially from the first air by mechanically cooling the first air with the mechanical cooling module, if:
      a wet bulb temperature of the second air is greater than or equal to an upper limit of an evaporative cooling wet bulb temperature range,
      a dew point of the first air is less than or equal to an upper limit of a dew point range, and
      a first temperature of the first air is greater than the supply air temperature set point.

8. The air module of claim 1, wherein the controller is further configured to:
   form supply air substantially from the first air by mechanically cooling the first air with the mechanical cooling module, if:
      a dew point of the first air is greater than an upper limit of a dew point range, and
      a dew point of the second air is greater than the upper limit of a dew point range; and
   form supply air substantially from the first air by mechanically cooling the first air with the mechanical cooling module, if:
      a dew point of the first air is greater than an upper limit of a dew point range, and
      a wet bulb temperature of the second air is greater than or equal to an upper limit of an evaporative cooling wet bulb temperature range.

9. The air module of claim 1, wherein the controller is further configured to:
   form supply air substantially from the second air by evaporatively cooling the second air with the evaporative cooling module, if:
      a dew point of the first air is less than a lower limit of a dew point range;
      a dew point of the second air is less than the lower limit of the dew point range;
      a first temperature of the first air is greater than the supply air temperature set point;
      a second temperature of the second air is greater than the first temperature of the first air; and
      a wet bulb temperature of the second air is less than a wet bulb temperature corresponding to the supply air temperature set point at the lower limit of the dew point range.

10. The air module of claim 1, wherein the controller is further configured to:
   form mixed air by mixing the first air at a first temperature and the second air at a second temperature, if:
      the second temperature of the second air is greater than the first temperature of the first air;

a dew point of the first air is greater than a lower limit of a dew point range; and a dew point of the second air is less than the lower limit the dew point range; and form the supply air by evaporatively cooling the mixed air with the evaporative cooling module.

11. A computer implemented method for controlling an air module comprising:

generating, by a controller, a first instruction to cause an intake module to selectively mix, based upon a supply air temperature set point, first air and second air to form intake air;

generating, by the controller, a second instruction to selectively cool the intake air to form supply air, wherein the second instruction comprises at least one of instructions to cause an evaporative cooling module to selectively cool, based on at least the supply air temperature set point, the intake air, and instructions to cause a mechanical cooling module to selectively cool, based on at least the supply air temperature set point, the intake air; and operating the air module according the first and second instructions.

12. The method of claim 11, wherein the first instruction comprises instructions to form the intake air substantially from the first air, if:

a temperature of the first air is less than the supply air temperature set point.

13. The method of claim 11, wherein the first instruction comprises instructions to form the intake air by mixing the first air and the second air, if:

a first temperature of the first air is greater than the supply air temperature set point, a second temperature of the second air is less than or equal to the supply air temperature set point, and a dew point of the second air is less than or equal to an upper limit of a dew point range and greater than or equal to a lower limit of the dew point range.

14. The method of claim 11, wherein the first instruction comprises instructions to form intake air by mixing the first air and the second air and the second instruction comprises instructions to cause the evaporative cooling module to selectively cool, based on at least the supply air temperature set point, the intake air, if:

a first temperature of the first air is greater than the supply air temperature set point, a second temperature of the second air is less than the first temperature, a dew point of the second air is less than a lower limit of a dew point range, and a wet bulb temperature of the second air is less than or equal to a wet bulb temperature corresponding to the supply air temperature set point at the lower limit of a dew point range.

15. The method of claim 11, wherein the first instruction comprises instructions to create intake air substantially from second air and the second instruction comprises instructions to cause the evaporative cooling module to selectively cool, based on at least the supply air temperature set point, the intake air, if:

a first temperature of the first air is greater than the supply air temperature set point, a second temperature of the second air is greater than the supply air temperature set point, a dew point of the second air is less than or equal to an upper limit of a dew point range, and a wet bulb temperature of the second air is within an evaporative cooling wet bulb temperature range.

16. The method of claim 11, wherein the first instruction comprises instructions to create intake air substantially from first air, wherein the second instruction comprises instructions to cause the mechanical cooling module to selectively cool, based on at least the supply air temperature set point, the intake air, if:

a dew point of the second air is greater than an upper limit of a dew point range, a dew point of the first air is less than or equal to an upper limit of a dew point range, and a first temperature of the first air is greater than the supply air temperature set point; and wherein the first instruction comprises instructions to create intake air substantially from first air and the second instruction comprises instructions to cause the mechanical cooling module to selectively cool, based on at least the supply air temperature set point, the intake air, if:

a wet bulb temperature of the second air is greater than or equal to an upper limit of an evaporative cooling wet bulb temperature range, a dew point of the first air is less than or equal to an upper limit of a dew point range, and a first temperature of the first air is greater than the supply air temperature set point.

17. The method of claim 11, wherein the first instruction comprises instructions to create intake air substantially from first air and the second instruction comprises instructions to cause the mechanical cooling module to selectively cool, based on at least the supply air temperature set point, the intake air, if:

a dew point of the first air is greater than an upper limit of a dew point range, and a dew point of the second air is greater than the upper limit of a dew point range; and wherein the first instruction comprises instructions to create intake air substantially from first air and the second instruction comprises instructions to cause the mechanical cooling module to selectively cool, based on at least the supply air temperature set point, the intake air, if:

a dew point of the first air is greater than an upper limit of a dew point range, and a wet bulb temperature of the second air is greater than or equal to an upper limit of an evaporative cooling wet bulb temperature range.

18. The method of claim 11, further comprising:

wherein the first instruction comprises instructions to create intake air substantially from second air and the second instruction comprises instructions to cause the evaporative cooling module to selectively cool, based on at least the supply air temperature set point, the intake air, if:

a dew point of the first air is less than a lower limit of a dew point range;

a dew point of the second air is less than the lower limit of the dew point range;

a first temperature of the first air is greater than the supply air temperature set point;

a second temperature of the second air is greater than the first temperature of the first air; and a wet bulb temperature of the second air is less than a wet bulb temperature corresponding to the supply air temperature set point at the lower limit of the dew point range.

19. The method of claim 11, further comprising:
wherein the first instruction comprises instructions to form intake air by mixing the first air at a first temperature and the second air at a second temperature, and the second instruction comprises instructions to cause the evaporative cooling module to selectively cool, based on the at least the supply air temperature set point, the intake air, if:
the second temperature of the second air is greater than the first temperature of the first air;
a dew point of the first air is greater than a lower limit of a dew point range; and
a dew point of the second air is less than the lower limit the dew point range.

20. A modular data center comprising: an air module comprising:
an air module controller;
an air intake module configured to receive first air from a first air source and to receive second air from a second air source;
an evaporative cooling module in fluid communication with the air intake module;
a mechanical cooling module in fluid communication with the evaporative cooling module;
a fan array in fluid communication with the mechanical cooling module;
wherein the air module controller is configured to cause the intake module to mix the first air and the second air based on at least a supply air temperature set point to form intake air, and wherein the controller is configured to form supply air by at least one of causing the evaporative cooling module to cool the intake air selectively based on at least the supply air temperature set point, and causing the mechanical cooling module to cool the intake air selectively based on at least the supply air temperature set point;
one or more data center modules comprising
a data center module controller;
a data center module intake damper configured to control supply air entering the data center module;
wherein the data center module controller is configured to actuate the data center module intake damper based on at least one of a temperature and humidity of air in the data center module; and
a supply air conduit in fluid communication with the air module and a data center module via the data center module intake damper of the one or more data center modules to carry supply air from the air module to the one or more data center modules, wherein the air module controller is further configured to adjust an air flow of the fan array to maintain a substantially constant air pressure in the supply air conduit.

* * * * *